(12) United States Patent
Nistler et al.

(10) Patent No.: US 7,098,661 B2
(45) Date of Patent: Aug. 29, 2006

(54) MAGNETIC RESONANCE DEVICE WITH A HIGH FREQUENCY SHIELD HAVING A HIGH FREQUENCY SHORT CIRCUIT TO THE CIRCUITS BOUNDARY SURFACE OF THE BASIC FIELD MAGNET

(75) Inventors: Jürgen Nistler, Erlangen (DE); Stefan Stocker, Grossenseebach (DE); Markus Vester, Nümberg (DE)

(73) Assignee: Siemens Aktiengesellschaft, Munich (DE)

( * ) Notice: Subject to any disclaimer, the term of this patent is extended or adjusted under 35 U.S.C. 154(b) by 5 days.

(21) Appl. No.: 10/957,435

(22) Filed: Oct. 1, 2004

(65) Prior Publication Data

US 2005/0073311 A1   Apr. 7, 2005

(30) Foreign Application Priority Data

Oct. 1, 2003   (DE) ................................ 103 45 767

(51) Int. Cl.
*G01V 3/00* (2006.01)

(52) U.S. Cl. ...................................... 324/318; 324/322
(58) Field of Classification Search ...................... None
See application file for complete search history.

(56) References Cited

U.S. PATENT DOCUMENTS

| | | | |
|---|---|---|---|
| 4,864,241 A | | 9/1989 | Goldie |
| 5,331,281 A | * | 7/1994 | Otsuka ........................ 324/318 |
| 5,574,372 A | * | 11/1996 | Moritz et al. ................ 324/318 |
| 6,531,870 B1 | * | 3/2003 | Heid et al. ................... 324/318 |
| 6,798,203 B1 | * | 9/2004 | Nistler et al. ................ 324/318 |
| 6,842,003 B1 | * | 1/2005 | Heid et al. ................... 324/318 |
| 6,850,206 B1 | * | 2/2005 | Heid et al. ................... 343/787 |
| 6,906,520 B1 | * | 6/2005 | Heid et al. ................... 324/322 |
| 6,930,482 B1 | * | 8/2005 | Heid et al. ................... 324/318 |
| 2002/0105329 A1 | * | 8/2002 | Heid et al. ................... 324/318 |
| 2002/0145428 A1 | * | 10/2002 | Nistler et al. ................ 324/318 |
| 2003/0109783 A1 | * | 6/2003 | Heid et al. ................... 600/421 |
| 2003/0184298 A1 | * | 10/2003 | Heid et al. ................... 324/318 |
| 2004/0239327 A1 | * | 12/2004 | Heid et al. ................... 324/318 |
| 2005/0073311 A1 | * | 4/2005 | Nistler et al. ................ 324/318 |
| 2005/0073312 A1 | * | 4/2005 | Heid ........................... 324/318 |

FOREIGN PATENT DOCUMENTS

| | | | |
|---|---|---|---|
| DE | 34 45 724 A1 | | 6/1985 |
| DE | 44 14 371 A1 | | 7/1995 |
| DE | 101 56 770 A1 | | 7/2002 |
| EP | 151726 | * | 8/1985 |
| GB | 2153080 A | * | 8/1985 |

* cited by examiner

*Primary Examiner*—Diego Gutierrez
*Assistant Examiner*—Tiffany A. Fetzner

(57) ABSTRACT

A magnetic resonance device with a cavity and with a basic field magnet and a gradient coil system, with the basic field magnet having a cavity that is bounded by an electrically conductive boundary surface of the basic field magnet and in which the gradient coil system is arranged, containing the following features:

the gradient coil system has at least two structurally separate units with a clearance between them, with each of the units being enclosed by the high-frequency shield;

the high-frequency shield has a short clearance from the boundary surface such that, because of the capacitive coupling between the high-frequency shield and the boundary surface, the high-frequency shield has a high-frequency short circuit to the boundary surface, so that the boundary surface is a surface that is always available for the high-frequency return flow.

13 Claims, 1 Drawing Sheet

MAGNETIC RESONANCE DEVICE WITH A HIGH FREQUENCY SHIELD HAVING A HIGH FREQUENCY SHORT CIRCUIT TO THE CIRCUITS BOUNDARY SURFACE OF THE BASIC FIELD MAGNET

CROSS REFERENCE TO RELATED APPLICATIONS

This application claims priority to the German application No. 10345767.4, filed Oct. 1, 2003 and which is incorporated by reference herein in its entirety.

FIELD OF INVENTION

The invention relates to a magnetic resonance device with a cavity and with a gradient coil system arranged in the cavity.

BACKGROUND OF INVENTION

Magnetic resonance technology is a known technology used mainly to obtain pictures of the inside of a body of an object under investigation. To do this, rapidly switched gradient fields that are generated by a gradient coil system are superimposed on a static basic magnetic field generated by a basic field magnet, in a magnetic resonance device. Furthermore, the magnetic resonance device has a high-frequency antenna that radiates high-frequency signals into the object under investigation to trigger magnetic resonance signals and records the triggered magnetic resonance signals, on the basis of which the magnetic resonance pictures are created.

SUMMARY OF INVENTION

From DE 44 14 371 A1, a magnetic resonance device is known whereby a high-frequency shield is arranged between a high-frequency antenna and a gradient coil system of the magnetic resonance device, and is designed in such a way that it allows electromagnetic fields in the low-frequency range, generated by the gradient coil system, to pass and does not allow those in the high-frequency range, generated by the high-frequency antenna, to pass. For this purpose, the high-frequency shield has a first electrically conductive layer arrangement and, arranged opposite it and separated from it by a dielectric, a second electrically-conductive layer arrangement, with the layer arrangements having printed conductors arranged side by side and separated from each other by electrically insulated slots, with the slots of the first layer arrangement being offset relative to those in the second and with in a least one layer arrangement adjacent conductors being connected to each other by specially arranged bridges, capacitors for example, that conduct high-frequency currents.

Furthermore, from DE 34 45 724 A1 a hollow cylindrical gradient field coil structure of a magnetic resonance device is known that on its inner and/or outer side has a shielding layer against high-frequency fields of a high-frequency antenna. As a component, the gradient field coil structure extends essentially over the complete length of the basic field magnet of the magnetic resonance device. The high-frequency antenna is arranged concentrically within the gradient field coil structure.

Furthermore, from DE 43 44 287 C1, a magnetic resonance device with a superconducting basic field magnet is known. Gradient coil systems on a supporting tube and a high-frequency antenna are fitted in an opening of the magnet. The basic field magnet is designed as a hollow cylinder so that the opening has a cylindrical shape. The supporting tube is fitted as one piece into the opening and extends over its complete length.

Finally, from DE 101 56770 A1 a magnetic resonance device with a gradient coil system is known, whereby an electrically-conductive structure is arranged and designed in such a way that at least within an imaging volume of the magnetic resonance device a magnetic field created from a gradient field by induction effects is similar to the structure of the gradient field. In this case, in one form of embodiment at least one part of the structure has a component of a basic field magnet designed in the shape of an enclosing jacket. One advantage of this is that the gradient coil system can be formed without gradient shield coils because undesirable consequences of the switched gradient fields due to the similarity of the magnetic field generated by the structure by a pre-distortion are almost completely controllable, so that no attenuation of the gradient fields because of the gradient shield coils takes place.

A magnetic resonance device is known from U.S. Pat. No. 4,864,241, whereby eddy currents are compensated. This is achieved by means of a special control of gradient coils that are assembled in a hollow cylindrical unit. To generate HF fields, a HF antenna, also in the shape of a hollow cylinder, with a smaller radius is fitted within the gradient coil unit.

Because of the high flowing currents, gradient coil units are generally exposed to strong inductive forces. They are generally attached to a housing of a basic field magnet. For reasons of accessibility, e.g. for changing the gradient coil unit, the attachment is of a disconnectable kind. The disconnectable attachment is particularly necessary because the basic field magnet is one of the most expensive components of the magnetic resonance unit and is therefore mounted so as to be as independent as possible from the remaining more maintenance-intensive components.

An object of the invention is to provide a magnetic resonance unit with improved high-frequency properties.

This object is achieved by the claims. Advantageous embodiments are described in the dependent claims.

This means that the high-frequency shield has high-frequency connection via the boundary surface, e.g. to ground potential, and is therefore potential-free with regard to high frequency, i.e. shock voltages and/or potential transfer (e.g. through gradient connecting cables) are advantageously prevented. Furthermore, the quality of a high-frequency antenna is also improved because the area around the boundary surface available for the high-frequency current return flow is increased. Therefore, a high-frequency field return flow space is limited by the boundary surface and the parts of the high-frequency shield opposite the boundary surface.

In order to make the high-frequency currents on the high-frequency shield and boundary surface reproducible and controllable, additional short-circuit bands can be provided between the high-frequency shield and the boundary surface. Thus, for example, six-teen short-circuit bands are arranged in azimuth fashion on each side of a hollow cylindrical basic field magnet.

In addition to structures consisting of symmetrical cylinders, the invention can also be of analog construction with an open magnetic resonance device with a plate-shaped gradient coil system.

The need for a high-frequency short-circuit of the high-frequency shield and boundary surface is due firstly to the divided design of the gradient coil system and the associated utilization of the space between the gradient coil unit and the basic field magnet as a high-frequency field return flow space. The documents mentioned in the introduction reveal no such use of this space or no such structure. Accordingly, the gradient coil systems are normally secured to a carrier that extends over the complete length, i.e. the gradient coil systems are of single-part construction, and are, if at all, also surrounded only as a single part by the high-frequency shield.

(DE 34 45 724 A1). This means that no high-frequency field can pass through the gradient coil system and also, with regard to a specified high-frequency current circuit, no specific field return flow space need be created.

BRIEF DESCRIPTION OF THE DRAWINGS

Further advantages, features and details of the invention are given in the exemplary embodiments described in the following with the aid of figures. The figures are as follows.

DETAILED DESCRIPTION OF INVENTION

Figure 1:
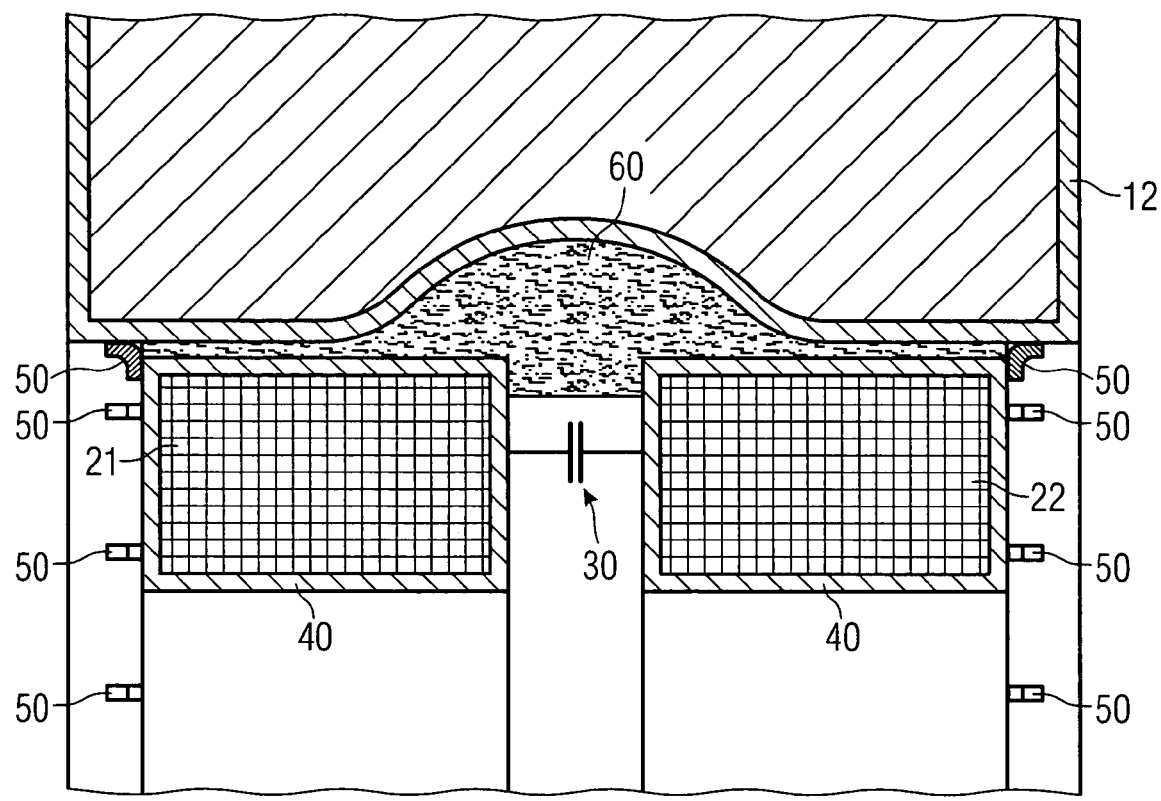
FIG. 1 is a longitudinal section through an upper half of a magnetic resonance device with a tunnel-type space to take a patient, with a basic field magnet having a cavity that bulges in the shape of an enclosing jacket, and with a gradient coil system enclosed by a high-frequency shield, with the high-frequency shield being connected via short-circuit bands to an electrically-conductive boundary surface of the cavity.

FIG. 1 is an exemplary embodiment of the invention showing a longitudinal section through the top half of a magnetic resonance device with a tunnel-shaped space to take the patient. To generate a static basic magnetic field in the patient space that is as homogenous as possible, the magnetic resonance device has a super-conducting basic field magnet that is essentially shaped like a hollow cylinder, with an electrically-conducing vacuum container 12 of the basic field magnet for implementing the concept of DE 101 56 770 A1, mentioned in the introduction, being bulge-shaped to form an enclosing jacket in the area of the cavity. The cavity of the basic field magnet contains a generator of time-variable magnetic fields, including a non-active shielded gradient coil system and a high-frequency antenna. The generator is connected to the basic field magnet, in that a space between both elements is filled with a compound 60 that has low dielectric high-frequency losses, and which stiffens the complete arrangement to reduce mechanical vibration and oscillation, with the generation of noise when the magnetic resonance unit is operating being counteracted.

The gradient coil system has two separate hollow cylindrical units 21 and 22, which to generate gradient fields that can be rapidly switched have a first and second transverse gradient coil and a longitudinal gradient coil. Each of the two units 21 and 22 is essentially enclosed by a high-frequency shield 40. Parts 30 of a high-frequency antenna, that for example include antenna rods and resonator capacitors to form a low-pass birdcage high-frequency antenna, are arranged between the high-frequency shield 40 of both units 21 and 22. In this way, a part of the high-frequency shield 40 also forms a part of the current paths of the high-frequency antenna, with the aforementioned parts 30 of the high-frequency antenna having a conducting high-frequency connection to the high-frequency shield 40.

The high-frequency shield 40 in this case is arranged to have a small clearance from the vacuum container 12 in such away that because of the capacitive coupling of the high-frequency shield 40 thus created there is a high-frequency short-circuit to the vacuum container 12. A high-frequency field return flow space is thus bounded by the side of the vacuum container facing the gradient coil system, by the side of the high-frequency shield facing the vacuum container and by the high high-frequency antenna. Accordingly, these conducting surfaces essentially form a high-frequency resonator on which a current generating the high-frequency field flows. Advantageously the vacuum container is at ground potential, so that the high-frequency shield 40 is also grounded. Shock voltages and also potential transfer, for example through the gradient connecting cable, are thus advantageously prevented. In addition, the quality of the high-frequency antenna can be improved, in that the high-frequency shield 40 has an electrically conducting connection to vacuum container 12 by means of a few, for example sixteen, short-circuit bands 50 arranged around the circumference. More stable high-frequency currents are thus created in the high-frequency resonator because they are less influenced by interference in the transition area between the high frequency shield 40 and vacuum container 12.

Figure 2:
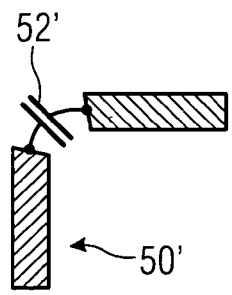
FIG. 2 is a longitudinal section through a short-circuit band with a series capacitor.

In another form of embodiment of the invention, the short-circuit bands 50 of FIG. 1 are replaced by short-circuit bands 50' as shown in FIG.2, that are provided with a series capacitor 52' to compensate for self-inductance of the short-circuit bands 50'.

The aforementioned description also applies as appropriate to basic field magnets with a cylindrical cavity without a bulge, for active-shielded gradient coil systems and/or for gradient coil systems that do not consist of two halves structurally separated from each other.

Furthermore, for a comprehensive description of the advantages of a gradient coil system with two units 21 and 22 with a high-frequency antenna arranged in between compared with conventional solutions and the distribution of conductors of gradient coils on both units 21 and 22, refer to the Applicant's subsequently published DE 103 13 229.

The invention claimed is:

1. A magnetic resonance device, comprising:
   a base field magnet having a cavity circumscribed by an electrically conductive boundary surface of the base field magnet;
   a gradient coil system arranged in the cavity, the gradient coil system including a first and a second unit arranged at a spaced apart distance;
   a high frequency shield individually enclosing the first and second units, the high frequency shield arranged adjacent to the boundary surface to allow a short circuit for high frequencies from the high frequency shield to the boundary surface so that the boundary surface is adapted to carry a high frequency return current flow; and
   a high frequency antenna, wherein parts of the high frequency antenna connect the high frequency shield individually enclosing the first unit to the high frequency shield individually enclosing the second unit so that a part of the high frequency shield forms a part of a current path for the high frequency antenna, the parts of the high frequency antenna allowing a short circuit for high frequencies between the high frequency shield individually enclosing the first unit and the high frequency shield individually enclosing the second unit.

2. The magnetic resonance device according to claim 1, wherein the parts of the high frequency antenna include antenna rods and resonator capacitors.

3. The magnetic resonance device according to claim 1, wherein at least a portion of the boundary surface is formed essentially as a drum-shaped sheath.

4. The magnetic resonance device according to claim 1, wherein the base field magnet is a superconducting base field magnet having a vacuum container forming the boundary surface.

5. The magnetic resonance device according to claim 1, wherein the gradient coil system is formed substantially as a hollow cylinder.

6. The magnetic resonance device according to claim 1, wherein the units are formed substantially as hollow cylinders.

7. The magnetic resonance device according to claim 1, wherein the boundary surface is adapted to generate at least a portion of an eddy current field triggered by a current change in a gradient coil of the gradient coil system, the portion of the eddy current field having a compensating effect within an imaging volume of the magnetic resonance device with respect to a non-linear component of a gradient field generated by the gradient coil.

8. The magnetic resonance device according to claim 7, wherein the gradient coil and the boundary surface are arranged relative to each other so that the eddy current field is similar in shape to the gradient field within the imaging volume.

9. The magnetic resonance device according to claim 7, wherein the gradient coil and the boundary surface are arranged relative to each other so that the eddy current field is similar in size to the gradient field within the imaging volume.

10. The magnetic resonance device according to claim 7, wherein the gradient coil and the boundary surface are arranged relative to each other so that the eddy current field is similar in intensity to the gradient field within the imaging volume.

11. The magnetic resonance device according to claim 1, wherein the high frequency shield is connected to the boundary surface by a plurality of short circuit strips.

12. The magnetic resonance device according to claims 11, wherein at least one of the short circuit strips has a series capacitor for compensating an inductance of the respective short circuit strip.

13. A magnetic resonance device having an upper and a lower half substantially symmetrical to each other relative to a cross-sectional plane, the upper half comprising:

a base field magnet having a cavity circumscribed by an electrically conductive boundary surface of the base field magnet;

a gradient coil system arranged in the cavity, the gradient coil system including a first and a second unit arranged at a spaced apart distance; and a high frequency shield individually enclosing the first and second units, the high frequency shield arranged adjacent to the boundary surface to allow a short circuit for high frequencies from the high frequency shield to the boundary surface so that the boundary surface is adapted to carry a high frequency return current flow.

* * * * *